United States Patent [19]

Houston

[11] Patent Number: 4,916,336
[45] Date of Patent: Apr. 10, 1990

[54] COLUMN SELECT CIRCUIT

[75] Inventor: Theodore W. Houston, Richardson, Tex.

[73] Assignee: Texas Instruments Incorporated, Dallas, Tex.

[21] Appl. No.: 130,769

[22] Filed: Dec. 9, 1987

[51] Int. Cl.$^4$ .................. H03K 19/094; H03K 19/082
[52] U.S. Cl. .................................... 307/449; 307/451; 307/463; 307/243; 365/230.06
[58] Field of Search ............... 302/443, 448, 451, 449, 302/463, 243; 365/230

[56] References Cited

U.S. PATENT DOCUMENTS 4,593,390 6/1986 Hildebrand et al. ................ 307/243
4,620,116 10/1986 Ozawa ................................. 307/443

Primary Examiner—Stanley D. Miller
Assistant Examiner—Margaret Rose Wambach
Attorney, Agent, or Firm—Rodney M. Anderson; Melvin Sharp

[57] ABSTRACT

A column select circuit for a memory device is disclosed which, for unselected data lines, provides a high impedance output. Each data line, and a corresponding decoded address signal, is received by a gate which passes the logic state of the data line (inverted), if selected, to a driver. The decoded address signal is also communicated to the driver, for tri-stating the driver for unselected data lines. The driver consists of a p-channel pull-up and an n-channel pull-down, with an n-channel isolation transistor connected in series therebetween. The driver output is at the junction of the pull-up and isolation devices. The gates of the pull-up and pull-down transistors are connected to the output of the gate, with the gate providing a high logic level when not selected, turning off the pull-up device. The isolation transistor is also turned off when the data line is not selected, isolating the output from both the power supply node and ground, which allows the output to be pulled by photoconduction toward mid-rail in a transient radiation event. A plurality of gate/driver pairs are provided within a stage of the select circuit, each having their outputs connected together. The select circuit may be made up of a plurality of stages constructed as described above.

9 Claims, 3 Drawing Sheets

COLUMN SELECT CIRCUIT

This invention was made with Government support under contract No. DNA 001-86-C-0090 awarded by the Defense Nuclear Agency. The Government has certain rights in this invention.

This invention is in the field of integrated circuits, and specifically in the field of decoder circuits for integrated memory circuits.

BACKGROUND OF THE INVENTION

Memory cell arrays in conventional random access memory circuits (RAMs) are generally organized into independently selectable rows and columns. Selected address signals presented to the address terminals of the device are decoded by a row decoder to select a row of the memory cell array to be communicated to sense amplifiers. Others of the address signals are decoded by a column decoder in order to select one or more of the bits in the selected row from or to which data is to be read or written. Such column decoders in conventional RAMs thus in effect perform a multiplexing operation to select one of the many possible bits in a selected row.

Referring to FIG. 1, a common column decoding and demultiplexing scheme is illustrated, realized for the example of a one-of-four selection. Signals A0 and A0_ are the logical complement of one another, and constitute the least significant bit of the two address signals; similarly signals A1 and A1_ present the true and false state of the second least significant address bit. AND gates $10_0$ through $10_3$ are connected to the various combinations of the four true and false address lines, to generate a high logic level at its output responsive to the proper combination of address signals at its inputs. For example, the output of AND gate $10_2$ will be high responsive to address lines A0 and A1_ being high (address $10_2$). A high output from an AND gate 10 will turn on the associated pass transistor $12_0$ through $12_3$, which will connect the corresponding data line $D_0$ through $D_3$ to line OUT. Lines $D_0$ through $D_3$ are the data lines driven by, for example, four sense amplifiers in a RAM device, among which the circuitry of FIG. 1 is to select for application to line OUT. Alternatively, lines $D_0$ through $D_3$ may be the actual bit lines of the memory device, prior to sensing, for such memories which utilize a single sense amplifier for multiple columns. As shown in FIG. 1, transistor 14 is connected between line OUT and the $V_{dd}$ power supply, to precharge line OUT to $V_{dd}$ when signal PC at the gate of transistor 14 is high. Line OUT is then either pulled down if the state of the selected data line $D_0$ through $D_3$ is low, or left high if the selected data line is high. As is well known in the art, data lines $D_0$ through $D_3$ can directly drive (i.e., discharge or keep) line OUT, or may in turn gate a discharge capacitor to discharge line OUT in the event of a logic low thereupon. Many other realizations of the column decoder shown in FIG. 1 may of course be realized using the pass gate concept, including domino logic realizations and other precharge-discharge schemes. In addition, many more pass gates may be used to decode more address lines to select a bit or bits from a group of data lines much larger (e.g., a group of 128) than the four illustrated in FIG. 1.

It is well known that transient gamma radiation exposure of a device containing a circuit such as is shown in FIG. 1 can cause the pass transistors 12, and also the precharge transistor 14, to conduct due to photoconduction, even though the transistors are nominally off. If these transistors conduct in the off state, the state of line OUT could become upset from that of the logic state of the selected data line $D_0$ through $D_3$, due to the $V_{dd}$ power supply driving line OUT toward a high voltage through photoconducting transistor 14, and due to the unselected ones of data lines $D_0$ through $D_3$ pulling line OUT through their associated photoconducting pass transistors 12 to their logic level. If the sum of the photoconduction current through transistor 14 and the unselected pass transistors 12 reaches the level of the current through the selected one of pass transistors $12_0$ through $12_3$, an error can be produced. The worst case of such an event for the circuit of FIG. 1 is if the selected data line, for example line $D_0$, is at a low logic level and the unselected data lines $D_1$ through $D_3$ were at a high logic level. If the sum of the photoconduction current through the four "off" transistors 14 and $12_1$ through $12_3$ reaches the level of the current through the selected pass transistor $12_0$, the logic low level presented by data line $D_0$ would not be detected.

It is therefore an object of this invention to provide a column decoder circuitry which is more tolerant of pass transistors conducting in the off state, such as photoconduction occurring in transient radiation events.

It is yet another object of this invention to provide such a column decoder which is constructed in stages, so that a weakened output level from an earlier stage can be boosted by a subsequent stage, further increasing the transient radiation tolerance of the device.

It is yet another object of this invention to provide such a column decoder which has low fan-in and fan-out stages, thereby providing reduced switching-time-to-temperature sensitivity.

Other objects and advantages of the invention will become apparent to those of ordinary skill in the art having reference to the following specification in conjunction with the drawings.

SUMMARY OF THE INVENTION

The invention may be incorporated into a multi-stage column decoder, where each stage receives a number of data lines from the prior stage, or from the memory array for the first stage, and a number of decoded address signals. Within each stage, logic is provided to gate each of the data lines responsive to its associated decoded address line. If the decoded address line is asserted for a data line, the state of the data line drives a tristate driver; the address lines which are not asserted cause the tristate driver to go to a high impedance state. The high impedance state for unselected drivers isolates their data lines from the output of the decoder stage, so that photoconduction caused by transient radiation pulls the output node toward mid-rail, rather than high or low, increasing the radiation tolerance of the circuit. The multi-stage design boosts the output of each stage, so that a logic level from a stage which is degraded by the transient radiation event is restored.

DETAILED DESCRIPTION OF THE PREFERRED EMBODIMENT

Figure 2:
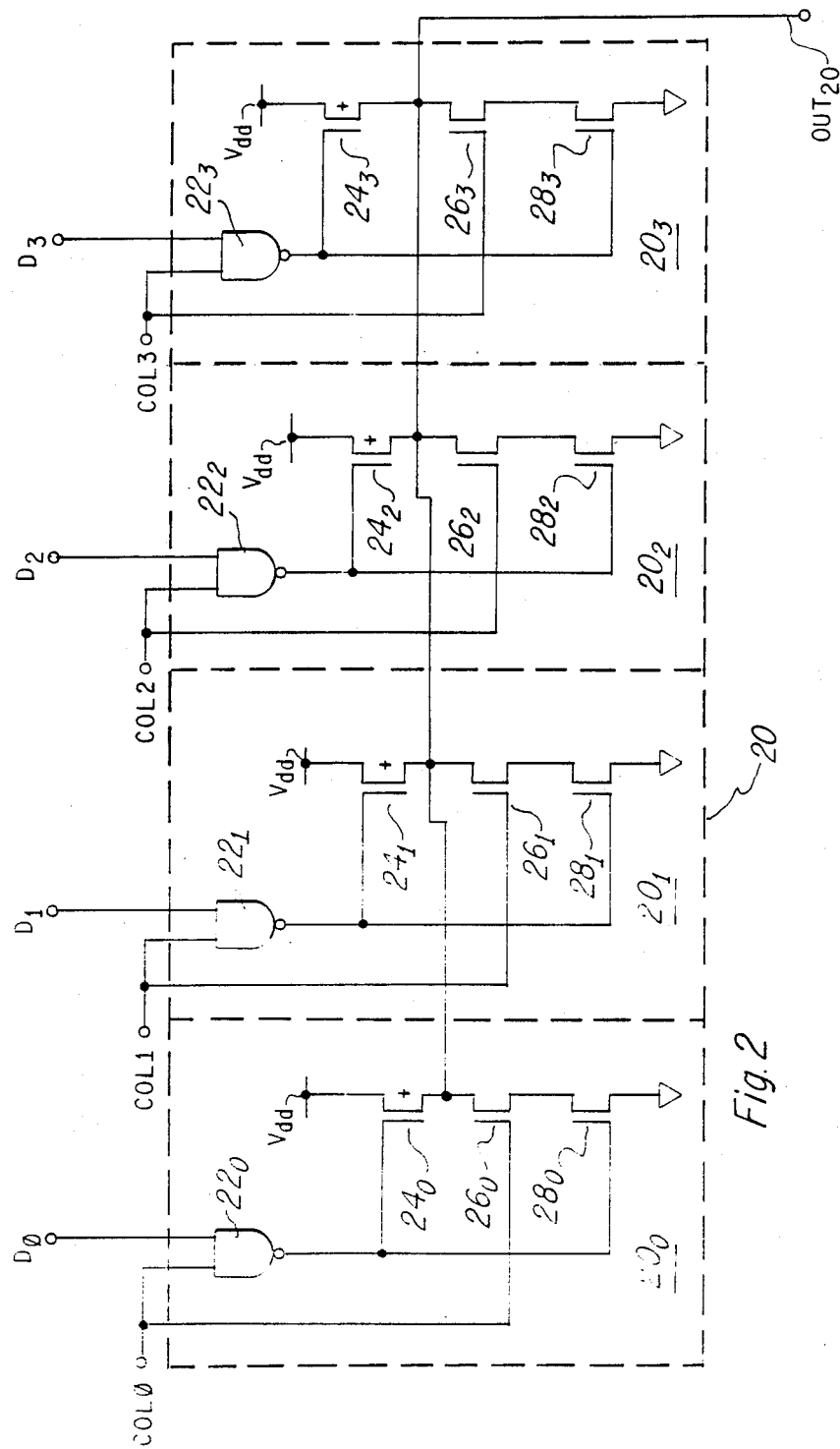
FIG. 2 is an electrical diagram, in schematic form, of a stage within a column decode and select circuit constructed according to the instant invention.

Referring now to FIG. 2, a stage 20 of a column decoder according to the invention will be described. For purposes of explanation, stage 20 in FIG. 2 will be described as the stage nearest the memory array; as will be further described below, the same stage design is equally applicable to subsequent stages within a multiple stage column decoder.

Figure 1:
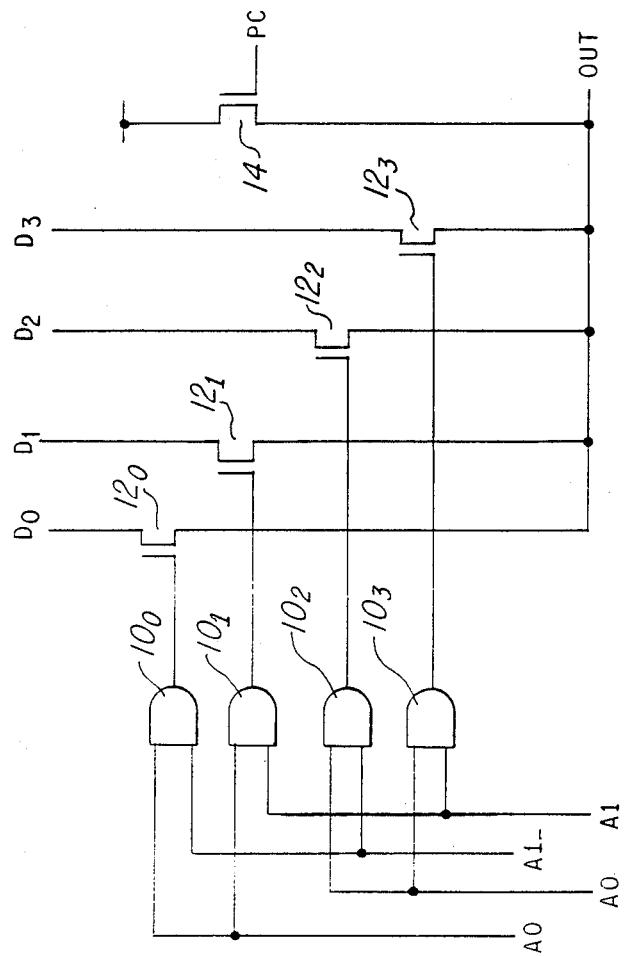
FIG. 1 is an electrical diagram, in schematic form, of a column decoder according to the prior art, utilizing a pass gate scheme.

Stage 20 receives signals on data lines $D_0$ through $D_3$ as data signals, similarly as the decoder illustrated in FIG. 1. Stage 20 receives the address inputs COL0 through COL3 for the selection of one of the data lines $D_0$ through $D_3$ at terminal $OUT_{20}$. The address signals on lines COL0 through are decoded address signals, such that one of the lines COL0 through COL3 will be asserted (i.e., at a high logic level) to select one of the four data lines $D_0$ through $D_3$, while the other three of the four address lines COL0 through COL3 will not be asserted (i.e., at a low logic level). Accordingly, lines COL0 through COL3 of FIG. 2 correspond to the four outputs of AND gates $10_0$ through $10_3$ illustrated in FIG. 1.

Stage 20 may be considered to consist of four substages $20_0$ through $20_3$, each of which receives one of data lines D0 through D3, and the corresponding one of address lines COL0 through COL3. Referring to substage $20_0$, NAND gate $22_0$ receives data line $D_0$ at one input, and its corresponding address line COL0 at its other input. The output of NAND gate $22_0$ is coupled to the gate of p-channel transistor $24_0$, and to the gate of n-channel transistor $28_0$. Address line COL0 is connected directly to the gate of n-channel transistor $26_0$. Transistors $24_0$, $26_0$, and $28_0$ have their source-to-drain paths connected in series between power supply node $V_{dd}$ and ground, with p-channel transistor $24_0$ serving as the pull-up transistor in the push-pull driver formed by the three transistors $24_0$, $26_0$, and $28_0$, n-channel transistor $28_0$ serving as the pull-down transistor, and transistor $26_0$ serving as an isolation transistor. The output of substage $20_0$ is at the node between the drains of transistors $24_0$ and $26_0$, and this node is directly connected to output line $OUT_{20}$, which is the output of stage 20.

In operation, in the event that address line COL0 is asserted to select data line $D_0$, the output of NAND gate $22_0$ will be the logical complement of the logic state of data line $D_0$. With line COL0 at a high logic level, transistor $26_0$ will be turned on, so that transistors $24_0$ and $28_0$ will serve as an inverting push-pull driver responsive to the logic state of the output of NAND gate $22_0$. Accordingly, when selected, the logic state of data line $D_0$ (twice inverted) will appear at the node between the drains of transistors $24_0$ and $26_0$, and communicated to the output of stage 20 at line $OUT_{20}$.

For unselected data lines $D_0$ through $D_3$ the corresponding address line COL0 through COL3 will be at a low logic level. Referring to substage $20_1$ as an example, line COL1 will be low when address line COL0 is at a high logic level. The output of NAND gate $22_1$ will thus be forced to a high logic level regardless of the state of data line $D_1$, turning off transistor $24_1$. In addition, the low logic level of line COL1 will turn off transistor $26_1$, connected between the drains of transistors $24_1$ and $28_1$. For the example where data line $D_0$ is selected, line $OUT_{20}$ is isolated from the $V_{dd}$ and ground nodes in substage $20_1$ by transistors $24_1$ and $28_1$ being off. Substages $20_2$ and $20_3$ will, in this example, similarly have address lines COL2 and COL3 at a low logic level, turning off their transistors 24 and 26 and allowing substage $20_0$ to drive line $OUT_{20}$.

As is well known in the art, transient radiation events cause, among other effects, source-drain photoconduction through otherwise off MOS transistors. As described above relative to the circuit of FIG. 1, photoconduction to or from one logic state can upset the sensing, or writing, of the other logic state. Referring to the circuit of FIG. 2, the transient radiation would tend to cause the otherwise-off transistors 24 and 26 in the unselected substages $20_0$ through $20_3$ to conduct. In the event of such photoconduction in the circuit of FIG. 2, line $OUT_{20}$ would tend to pull to a voltage somewhere between $V_{dd}$ and ground. Accordingly, the voltage differential between either the high or low logic state output by the selected one of substages $20_0$ through $20_3$ and the voltage to or from which photoconduction may conduct will be reduced from that of the circuit of FIG. 1, providing for an increased tolerance to transient radiation events.

Figure 3:
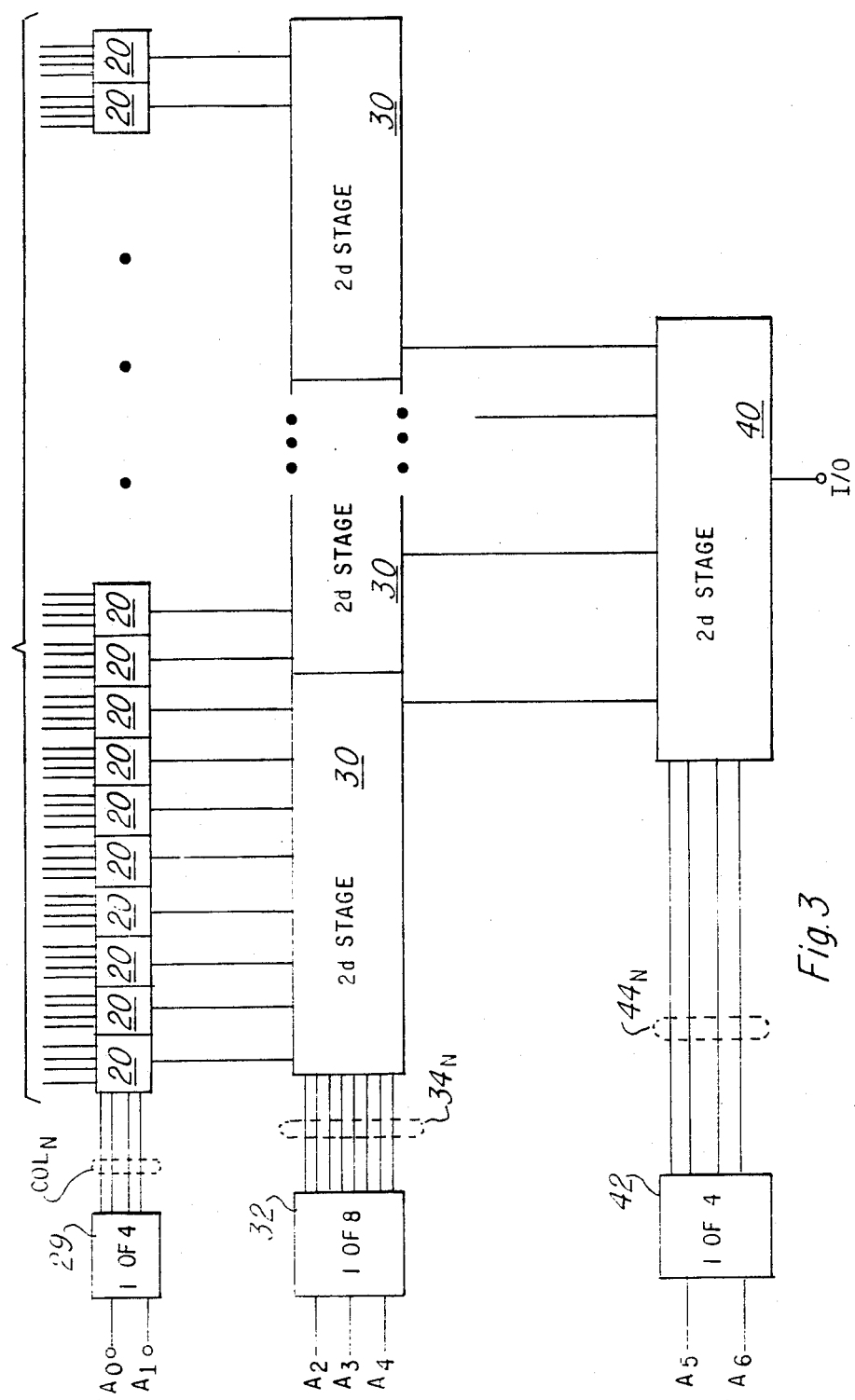
FIG. 3 is an electrical diagram, in block form, of a three-stage column decode and select circuit constructed according to the invention.

Referring now to FIG. 3, the incorporation of stage 20 into a multiple-stage column decode architecture will be explained. The example illustrated in FIG. 3 is for a 128 column array, decoded into a single output bit from seven column address signals A0 through A6. Stages 20 each receive four of data lines $D_0$ through $D_{127}$ as described above relative to FIG. 2; accordingly, there are thirty-two stages 20 in the embodiment of FIG. 3. The four address lines COL0 through COL3 (i.e., lines $COL_n$ of FIG. 3) are generated by one-of-four decoder 29, according to the value of the address signals on lines A0 and A1, and are communicated to each of the thirty-two stages 2.

A group of second stages 30 are constructed similarly as stage 20 shown in FIG. 2, but in this embodiment perform a one-of-eight selection; accordingly, there are four of second stages 30 in the embodiment of FIG. 3. Each of second stages 30 receive, as data inputs, the outputs of eight of stages 20. The corresponding address lines are presented to each of the four second stages 30 by lines $34_n$, one of which is asserted by one-of-eight decoder 32 responsive to the value of the address signal on address lines A2 through A4. Each of the four second stages 30 thus select and output the data state of one of its associated stages 20.

Third stage 40 performs the final selection of the bit from which data is to be read. Third stage 40 is also constructed similarly as stage 20 shown in FIG. 2, and receives the output from the four second stages 30 as its data input. Third stage 40 receives its corresponding address signals on lines $44_n$ from one-of-four decoder 42, generated according to the value on address lines A5 and A6. The selected one of data lines $D_0$ through $D_{127}$ is thus in communication with line OUT, through its stage 20, selected by the selected one of second stages 30.

The multiple stage selection accomplished by the circuit of FIG. 3 provides for the restoration of signals from the prior stage which have been degraded. Referring back to FIG. 2, the data state of a selected data line D0 through D3 is inverted by its corresponding one of NAND gates 22 to either a full high or low logic level. For second stages 30 or for third stage 40, the NAND gate receiving the output signal from the selected prior stage will similarly perform the logic inversion so long as the signal has not degraded to the point that its logic level is indeterminate (or incorrect). The driver consisting of transistors 24 and 28 within the selected substage 20$_n$ will then fully invert the output of its NAND gate 22, so any degradation of the signal received from a prior stage is eliminated by second stages 30 and third stage 40 constructed according to the invention. Furthermore, the use of multiple stages (i.e., low fan-in and fan-out circuits) will similarly boost signals which are degraded due to high temperature operation, providing for more constant performance of the circuit over a given temperature range.

It should further be noted that the stage embodiment illustrated in FIG. 2 can serve as a single stage decoder, in devices where the number of data lines is small or in devices where transient radiation tolerance is not a concern. As described above relative to the example of FIG. 1, either the selected data line D$_0$ through D$_3$ itself, or a sense amplifier, will be driving the load capacitance of line OUT (and the parasitic capacitance of transistor 14), the drive capability of either often being small considering the load being driven. The design of FIG. 2 provides amplification of the voltage of the selected data line, speeding up the communication of the selected memory cell to the output terminal.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A column selector for a memory device, comprising:
   a plurality of gates, each having an input for receiving a data signal and an input for receiving a decoded address signal, and each having an output for presenting a signal corresponding to the data signal responsive to its decoded address signal indicating selection of the data signal; and
   a plurality of drivers, each associated with one of said plurality of gates, each having an input connected to the output of its associated gate, for driving its output to a logic state corresponding to the output of its associated gate, and each having isolation means, connected to its corresponding decoded address signal, for placing its output in a high impedance state responsive to said decoded address signal indicating non-selection of its data signal;
   wherein the outputs of said plurality of drivers are connected together, for presenting a logic state corresponding to the logic state of the selected data signal.

2. The column selector of claim 1, wherein each of said plurality of drivers comprises:
   a pull-down transistor, having its gate coupled to the output of the associated gate; and
   a pull-up load;
   wherein said isolation means comprises an isolation transistor having its gate coupled to receive the associated decoded address signal, said isolation transistor being non-conductive responsive to said decoded address signal indicating non-selection of its data signal;
   and wherein the pull-up load and the the source to drain paths of said pull-down transistor and said isolation transistor are connected in series between a power supply node and a reference node.

3. The column selector of claim 2, wherein said pull-up load is a transistor, having its gate coupled to receive the output of its associated gate, and having its source-to-drain path connected in series with the source-to-drain paths of said pull-down transistor and said isolation transistor.

4. The column selector of claim 1, wherein each of said gates present a first logic state at its output responsive to its associated decoded address signal indicating non-selection of its data signal.

5. The column selector of claim 4, wherein each of said plurality of drivers comprises:
   a pull-down transistor, having its gate coupled to the output of the associated gate;
   a pull-up transistor, having its gate coupled to receive the output of the associated gate so that said pull-up transistor is non-conductive responsive to its associated decoded address signal indicating non-selection of its data signal;
   wherein said isolation means comprises an isolation transistor having its gate coupled to receive the associated decoded address signal, said isolation transistor being non-conductive responsive to said decoded address signal indicating non-selection of its data signal;
   and wherein the source-to-drain path of said pull-down transistor is connected in series between the source-to-drain path of said isolation transistor and a reference node, and the source-to-drain path of said pull-up transistor is connected in series between the source-to-drain path of said isolation transistor and a power supply node, the output of said driver being at the junction between said pull-up and isolation transistors.

6. A multiple-stage column decoder for selecting a data line of a memory responsive to a column address signal, comprising:
   a first address signal decoder for decoding a predetermined number of bits of said column address signal;
   a second address signal decoder for decoding a predetermined number of bits of said column address signal other than those decoded by said first address signal decoder;
   a plurality of first select stages, each connected to a plurality of data lines of said memory and to the output of said first address signal decoder, each for selecting a data line for output therefrom responsive to the output of said first address signal decoder, each of said first select stages comprising:
      a plurality of gates, each having an input for receiving a data signal and an input for receiving a decoded address signal from said first address signal decoder, and each having an output for presenting a signal corresponding to the data signal responsive to its decoded address signal indicating selection of the data signal; and
      a plurality of drivers, each associated with one of said plurality of gates, each having an input connected to the output of its associated gate, for driving its output to a logic state corresponding to the output of its associated gate, and each having isolation means, connected to its corresponding decoded address signal, for placing its output in a high impedance state responsive to said decoded address signal indicating non-selection of its data signal;

wherein the outputs of each of the plurality of drivers in a first select stage are connected together to present the output of their first select stage; and a second select stage, connected to the outputs of the plurality of first select stages and to the output of the second address signal decoder, for selecting one of the outputs of the plurality of first select stages responsive to the decoded address signals from said second address signal decoder.

7. The column decoder of claim 6, wherein said second select stage comprises:

a plurality of gates, each having an input for receiving the output of an associated one of said first select stages and an input for receiving a decoded address signal from said second address signal decoder, and each having an output for presenting a signal corresponding to the output of its associated first select stage responsive to its decoded address signal indicating selection thereof; and a plurality of drivers, each associated with one of said plurality of gates, each having an input connected to the output of its associated gate, for driving its output to a logic state corresponding to the output of its associated gate, and each having isolation means, connected to its corresponding decoded address signal, for placing its output in a high impedance state responsive to said decoded address signal indicating non-selection of its associated first select stage;

wherein the outputs of each of the plurality of drivers in said second select stage are connected together to present the output of the selected one of said first select stages.

8. The column decoder of claim 6, comprising a plurality of second select stages, and further comprising:

a third address signal decoder for decoding a predetermined number of bits of said column address signal other than those decoded by said first and second address signal decoders; and a third select stage, connected to the outputs of the plurality of second select stages and to the output of the third address signal decoder, for selecting one of the outputs of the plurality of second select stages responsive to the decoded address signals from said third address signal decoder.

9. The column decoder of claim 8, wherein said third select stage comprises:

a plurality of gates, each having an input for receiving the output of an associated one of said second select stages and an input for receiving a decoded address signal from said third address signal decoder, and each having an output for presenting a signal corresponding to the output of its associated second select stage responsive to its decoded address signal indicating selection thereof; and a plurality of drivers, each associated with one of said plurality of gates, each having an input connected to the output of its associated gate, for driving its output to a logic state corresponding to the output of its associated gate, and each having isolation means, connected to its corresponding decoded address signal, for placing its output in a high impedance state responsive to said decoded address signal indicating non-selection of its associated second select stage;

wherein the outputs of each of the plurality of drivers in said third select stage are connected together to present the output of the selected one of said second select stages.

* * * * *